United States Patent
Dawkins

(10) Patent No.: US 9,917,686 B2
(45) Date of Patent: Mar. 13, 2018

(54) TWO POINT POLAR MODULATOR

(71) Applicant: FRONTIER MICROSYSTEMS LIMITED, Oxfordshire (GB)

(72) Inventor: Mark Dawkins, Oxfordshire (GB)

(73) Assignee: ENSILICA LIMITED, Berkshire (GB)

( * ) Notice: Subject to any disclaimer, the term of this patent is extended or adjusted under 35 U.S.C. 154(b) by 0 days.

(21) Appl. No.: 14/996,017

(22) Filed: Jan. 14, 2016

(65) Prior Publication Data
US 2017/0207906 A1   Jul. 20, 2017

(51) Int. Cl.
*H04L 7/033* (2006.01)
*H04L 7/00* (2006.01)

(52) U.S. Cl.
CPC .......... *H04L 7/0331* (2013.01); *H04L 7/0091* (2013.01)

(58) Field of Classification Search
CPC ..................... H04L 7/0331; H04L 7/0091
USPC ........................................................ 375/376
See application file for complete search history.

(56) References Cited

U.S. PATENT DOCUMENTS

| | | | | |
|---|---|---|---|---|
| 7,587,179 B1* | 9/2009 | Groe | ......................... | H04B 1/04 332/145 |
| 8,731,502 B2* | 5/2014 | Salle | ......................... | G01S 7/032 332/103 |
| 2005/0041755 A1* | 2/2005 | Hammes | ............... | H03C 3/0925 375/295 |
| 2007/0036238 A1* | 2/2007 | Matero | ................ | H03C 3/0925 375/296 |

OTHER PUBLICATIONS

Youssef et al., "A low-power GSM/EDGE/WCDMA polar transmitter in 65-nm CMOS," IEEE J. of Solid-State Circuits, vol. 46, No. 12, pp. 3061-3074 (Dec. 2011).
CML Microcircuits Communication Semiconductors, Application Note, Two-Point MOdulation for dPMR using the CMX7041, pp. 1-12 (Aug. 2007).

* cited by examiner

*Primary Examiner* — Michael Neff
(74) *Attorney, Agent, or Firm* — Saul Ewing Arnstein & Lehr LLP

(57) ABSTRACT

A two-point phase modulator comprising a phase locked loop, PLL, having a voltage controlled oscillator, VCO, and a feedback path, a first modulation circuit for introducing a first modulation signal into the feedback path, the first modulation circuit generating the first modulation signal using a reference clock signal extracted from the PLL and derived from a first clock, a second modulation circuit for introducing a second modulation input into the VCO, the second modulation circuit generating the second modulation signal using a clock signal generated independently of the reference clock and a synchronizer for aligning the second modulation signal in time with the first clock signal.

18 Claims, 10 Drawing Sheets

TWO POINT POLAR MODULATOR

TECHNICAL FIELD

The present invention relates to two-point polar modulators.

BACKGROUND

Polar modulation is a technique used in a number of Radio Frequency (RF) transmitter architectures. Recently, it has found particular application in devices implementing the EDGE and 3G/UMTS telecommunication standards. Polar modulation is a combination of amplitude and phase modulation, which, instead of using in-phase and quadrature components as in quadrature modulation, uses the components of amplitude and phase. The modulation is performed separately for the amplitude and phase components, with the phase modulation typically performed using a Phase Locked Loop, PLL.

FIG. 1 is a schematic diagram of a transmitter (1) for implementing phase modulation (the components effecting amplitude modulation are not shown) and comprising a PLL (2) which in turn comprises a phase detector (3), a low pass filter (4), a voltage controlled oscillator VCO, (5), a divide-by-n divider (6) and a multi-modulus divider MMD (7). The phase modulation signal component (8) and a static RF channel selection signal (9) are summed at a summing unit (10a) and the result is fed into a sigma-delta modulator (10). By way of example, if the reference frequency (produced by the reference source (11)—see below) is 24 MHz and a carrier frequency of 2.4 GHz is required, the RF channel selection signal (9) is set to a value producing a divide ratio of 100 (at the MMD).

The sigma delta modulator (10) provides dithering for the input to the MMD, thus allowing (on average) a fractional divide ratio to be achieved. The specific dithering pattern also has a noise spectrum with energy concentrated at higher frequencies, which can be filtered by the low pass filter (4). The sigma-delta modulator signal is used to control the MMD (7), which divides the input signal by a value determined by the input from the sigma-delta modulator. The output of the MMD (7) is fed into the phase detector (3) which compares the output of the MMD with a reference signal (11a) generated by a crystal oscillator in the reference signal source ("reference clock") (11). The phase detector (3) produces an output which is proportional to the difference in phase between its two inputs.

The output of the phase detector (3) is fed into the low pass filter (4) which might typically have a cut-off frequency in the region of a few hundred KHz. The low pass filter or loop filter has two distinct functions. A first function is the determination of loop dynamics, i.e. the range over which the loop can lock, the speed of locking and damping. A second function is the removal of spurious signals from the phase detector, such as ripple and higher harmonics. The low pass filtered signal representing the phase difference is then fed into the VCO (5). The VCO changes its output frequency according to this input. The phase modulated output of the PLL, with frequency divided by N, is then sent to an amplifier (12) and on to an antenna (13). The transmission frequency is therefore defined by both the factor N of the divide-by-N divider (6) and the average divide ratio of the MMD (7).

The divided output is fed back to the MMD (7). The MMD generates at its output a signal corresponding to the input from the divider (6), further divided by a value corresponding to the input from the sigma-delta modulator (10). This feedback mechanism drives the output signal of the MMD (7) to have the same frequency as the reference signal and to have a fixed phase with respect to that reference signal. Since the divide ratio applied by the MMD varies in proportion to the phase modulation signal (8), the MMD input signal, and hence the input signal to the amplifier (12), has a frequency that varies in order to achieve the desired phase modulation.

The arrangement of FIG. 1 provides for only a very limited bandwidth due to the low pass filtering in the PLL, e.g. a bandwidth on the order of a few hundred KHz. In order to provide for a wider bandwidth of operation, two-point modulation may be used. Two-point modulation introduces a second modulation point in the PLL and is illustrated in FIG. 2. The phase modulation signal component (8) is fed into a digital to analogue converter DAC (14), which controls the input to a second modulation point (15), this point being an input to the VCO (5). As with the input to the VCO from the low pass filter (4), the signal input to the second modulation point (15) changes the output frequency of the VCO. As the second modulation signal is not applied to the VCO via the low pass filter (4), it is not directly affected by that filter. However, there is a high pass filtering effect on the second modulation signal due to low frequency signals being removed by the feedback. High frequency signals are filtered out of the feedback loop by the loop filter and hence there is no cancelling of higher frequency signals at the VCO.

To complete the polar modulation effect, an amplitude modulation signal (16) is provided, which is fed to an AM Digital to Analogue converter (17). The output (18) of the AM Digital to Analogue converter then modulates the output of the PLL at the amplifier (12).

FIG. 3 is a graphical representation of signal (19) and frequency (20) of the idealized frequency response of the two-point modulator of FIG. 2, and illustrates the overall effect of the two modulation points. A first component (21) of the spectrum is that caused by the input from the sigma delta modulator (10) whilst a second component (22) is that caused by the input from the DAC (14). Fortuitously, the second component is essentially the inverse of the first component resulting in a constant frequency response (providing that there are no timing or gain mismatches) for the two-point polar modulator.

FIG. 4 is a schematic diagram of a practical implementation of a two-point polar modulator, showing the clocking arrangements. In order to ensure that there are no timing mismatches between the two modulation points, a single clock is used to control both signals (shown in FIG. 4 with broken lines). This clock signal is provided by an additional output (7a) of the MMD (7) which essentially is a clock signal running at the frequency of the reference signal source (11). The clock signal is passed to the phase modulator (23) via a divide-by-m divider (24) (this divider allows the phase modulator to be operated at a slower rate than the PLL reference signal source (11)). The phase modulator (23) also receives at a further input the bit stream that is to be transmitted.

In order to implement modulation schemes which require smooth phase transitions during a transmission symbol, it is necessary to operate the phase modulator (23) so as to output a sequence of relatively small phase changes, typically eight to sixteen per symbol period. It is thus necessary to clock the phase modulator (23) at a rate that is a multiple of the desired symbol rate. For example, to transmit symbols at a rate of 2 MS/Sec, the phase modulator (23) must be clocked at 16

MHz or more (assuming the divide ratio of divider 24 is set to unity). Achieving even higher symbol rates becomes difficult or even impossible due to the limitations of crystal frequencies and costs.

SUMMARY OF THE INVENTION

The present invention seeks to overcome the problem described above by providing a two-point phase modulator and method of operating the same in which two separate clock signals can be provided for the different modulation points respectively.

According to a first aspect of the invention, there is provided a two point polar modulator comprising a phase locked loop, PLL, having a voltage controlled oscillator, VCO, and a feedback path; a first modulation circuit for introducing a first modulation signal into the feedback path, the first modulation circuit generating the first modulation signal using a first clock signal extracted from the PLL and derived from a first clock, a second modulation circuit for introducing a second modulation signal into the VCO, the second modulation circuit generating the second modulation signal using a clock signal generated independently of the first clock and a synchronizer for aligning the second modulation signal in time with the first clock signal.

In an embodiment, the first clock comprises a reference signal source configured to provide a reference signal to the PLL.

In an embodiment, the first modulation signal is introduced into the PLL by a multi-modulus divider, MMD.

In an embodiment, the two point modulator further comprises a sigma delta modulator for modulation the first modulation signal.

In an embodiment, the two point modulator is further configured to provide gain equalization between the first modulation signal and the second modulation signal.

In an embodiment, the two point modulator is further configured to provide to provide delay equalization between the first modulation signal and the second modulation signal.

In an embodiment, the two point modulator is further configured to provide pre-distortion to the VCO to linearize an output of the VCO.

In an embodiment, the second clock comprises an all-digital phase locked loop.

In an embodiment, the second clock signal has higher frequency than the first clock signal.

According to a second aspect of the present invention, there is provided a method of operating a two point polar modulator, the modulator comprising a phase locked loop, PLL, the PLL comprising a voltage controlled oscillator, VCO, and a feedback path. The method comprises the steps of generating a first modulation signal using a first clock signal extracted from the PLL and derived from a first clock, generating a second modulation signal using a clock signal generated independently of the first clock, aligning the second modulation signal in time with the first clock signal, introducing the first modulation signal into the feedback path and introducing the second modulation input into the VCO.

DETAILED DESCRIPTION

Embodiments will now be described more fully hereinafter with reference to the accompanying drawings, in which certain embodiments are shown. However, other embodiments in many different forms are possible within the scope of the present disclosure. Rather, the following embodiments are provided by way of example so that this disclosure will be thorough and complete, and will fully convey the scope of the disclosure to those skilled in the art.

Figure 1:
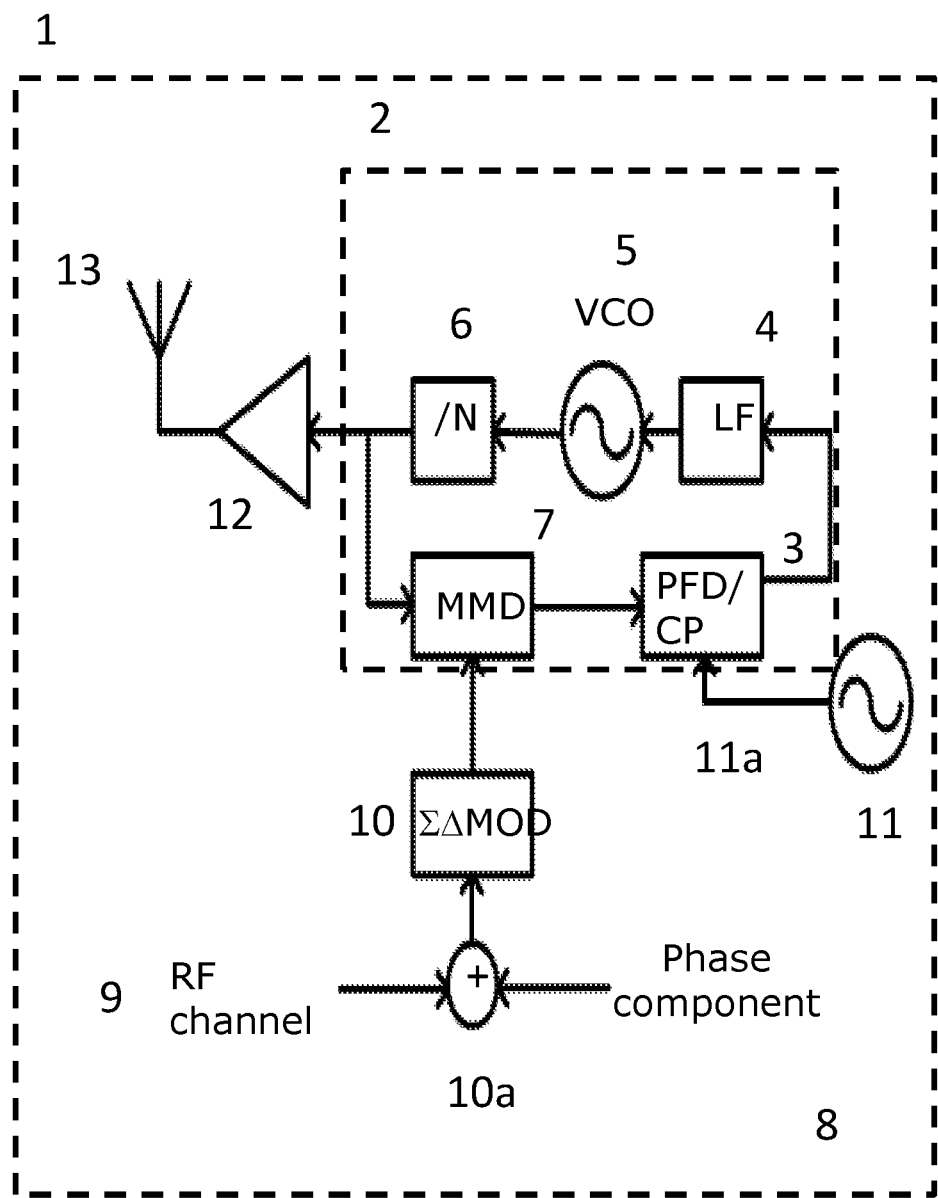
FIG. 1 is a schematic diagram of a one-point polar modulator (showing phase modulation only) according to the prior art.
Figure 2:
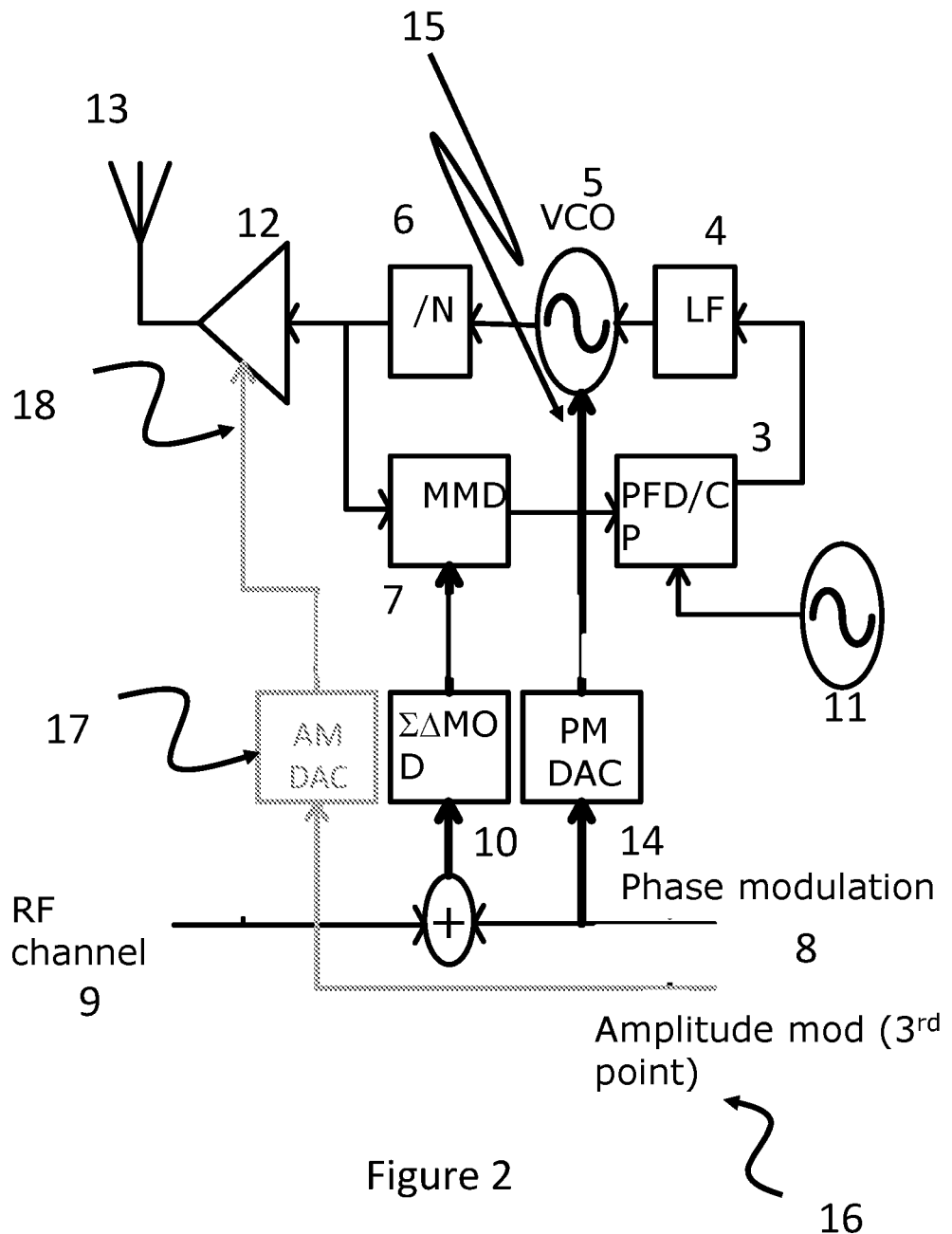
FIG. 2 is a schematic diagram of a polar modulator with two-point phase modulation according to the prior art.
Figure 3:
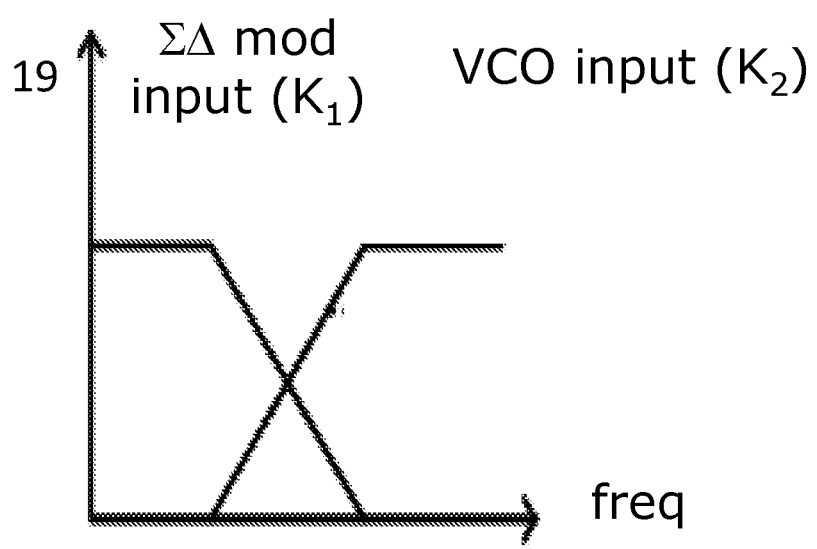
FIG. 3 is a graph showing the idealized frequency spectrum of the two-point polar modulation scheme achieved by the modulator of FIG. 2.
Figure 4:
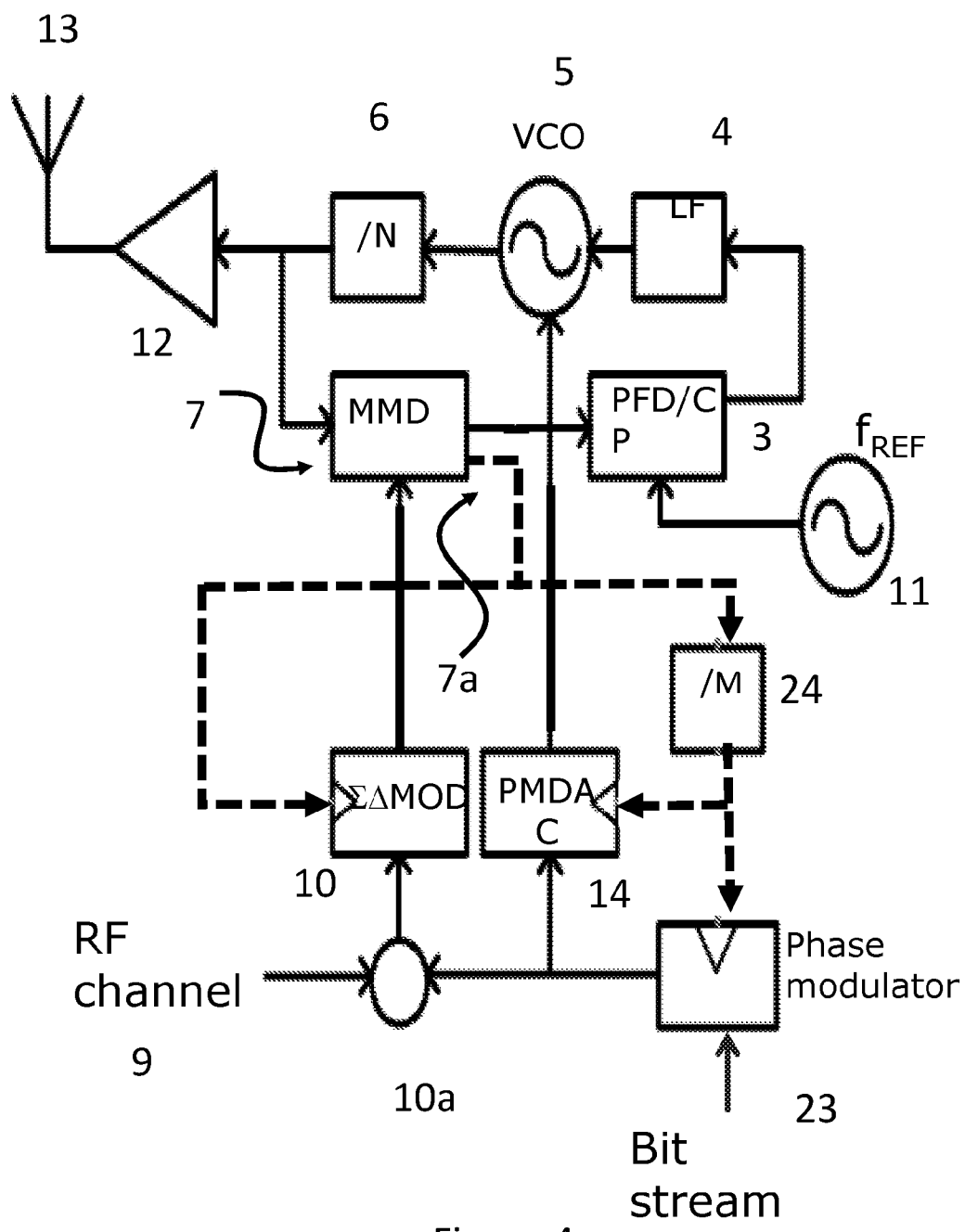
FIG. 4 is a schematic diagram of a practical implementation of a two-point polar modulator with a single clock.

A two-point polar modulation scheme and apparatus is described here which seeks to overcome the problem of the bandwidth limit imposed by the prior art clocking arrangements (FIG. 4). A two clock arrangement is provided in which one of the clocks provides the timing for the lower frequency range modulation which occurs at the phase detector and a second clock is provided for the higher frequency range modulated at the Voltage Controlled Oscillator, VCO. In order to overcome the problems associated with timing mismatches between the two modulation points and the resulting errors this causes, the modulation signal for the higher frequency range is synchronized with the clock controlling the signal for the low frequency range.

Figure 5:
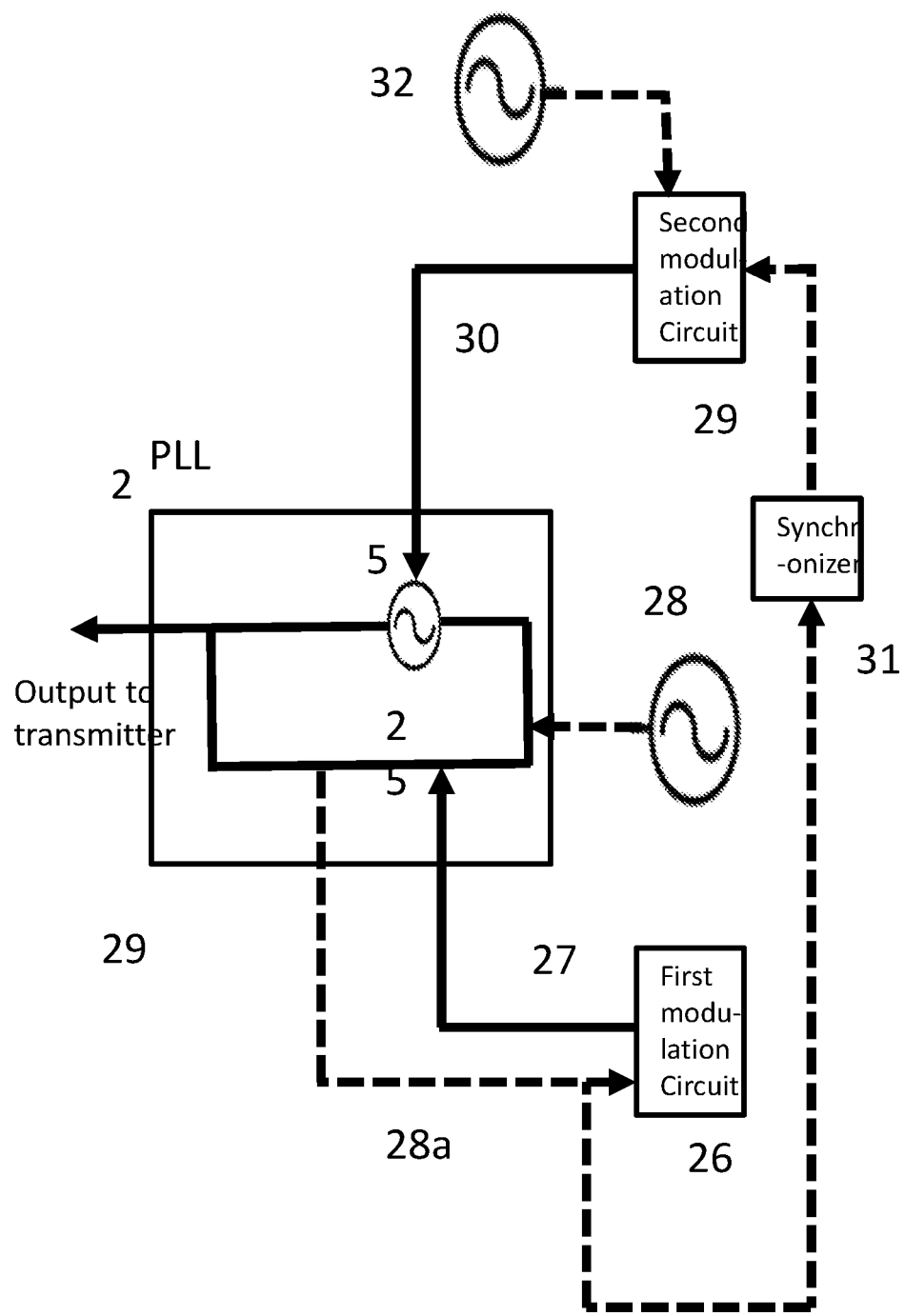
FIG. 5 is a schematic overview of a two-point polar modulator according to an embodiment.

FIG. 5 is a schematic overview of a two-point polar modulator. The modulator comprises a PLL (2), which has a VCO (5) and a feedback loop (25). A first modulation circuit (26) generates the first modulation signal (27), which is introduced into the feedback loop (25). The first modulation circuit is generated using first clock signal (28a) extracted from the PLL and derived from a reference clock (28). A second modulation circuit (29) generates a second modulation signal (30), which is introduced into the PLL via the VCO (5). The second modulation signal is generated from a second clock signal (32), generated independently of the first clock. A synchronizer (31) aligns the second modulation signal in time with the first clock signal.

In an embodiment, the first clock signal (28a) is derived from the reference signal from the reference signal source as fed into the phase detector of the PLL. The clock signal from the first clock, henceforth referred to as the "first clock signal", is taken from the PLL and is used to generate the first modulation signal. In an embodiment, the first clock signal is fed into a synchronizer, which aligns the second modulation signal with the first clock signal. In an embodiment, a second clock signal controls the phase modulator and the generation of the second modulation signal.

In an embodiment, the first modulation signal is modulated using sigma delta modulation. The person skilled in the art will appreciate that other arrangements are possible and the invention is not limited to any one modulating arrangement or combination of modulating arrangements for either or both modulating points.

Figure 6:
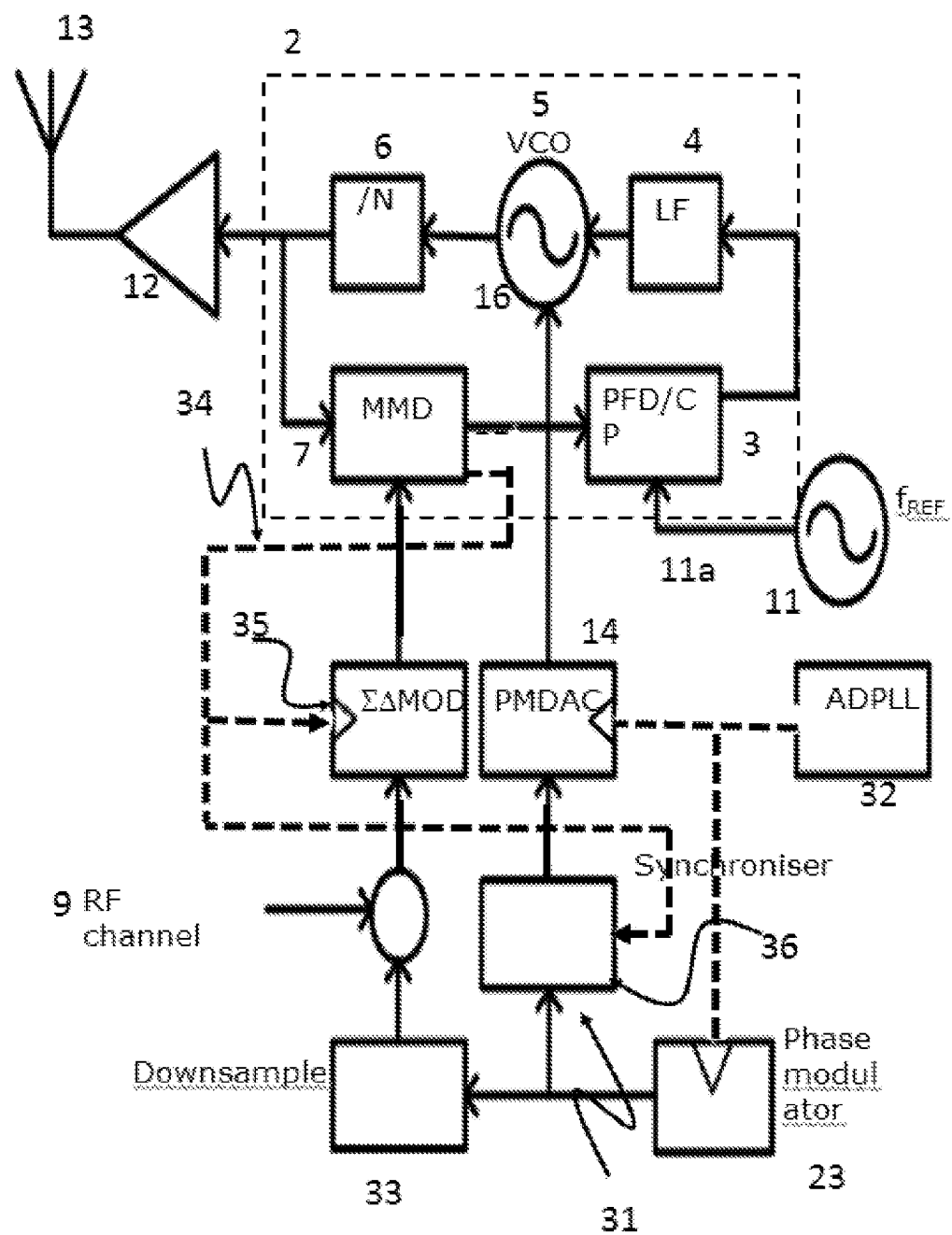
FIG. 6 is a schematic diagram of a two-point polar modulator according to an embodiment.

FIG. 6 illustrates schematically and in more detail the embodiment of FIG. 5. A baseband signal is generated by the phase modulator (23), which is controlled by the second clock (32). In an embodiment the second clock is provided by an all-digital phase locked loop, ADPLL, but the person skilled in the art will appreciate that there are alternative arrangements and the invention is not limited to any one method of providing the second clock signal. The signal from the phase modulator is fed to a downsampler (33), which selects the lower frequency components of the signal. In an embodiment, the downsampler is a low pass filter. The output of the downsampler (33) is combined with a static RF channel selection input (9) and provides to the sigma delta modulator (10).

The output of the phase modulator (23) also provides the input to a synchronizer (31), which synchronizes the output of the phase modulator with the first clock signal. The first clock signal (34) is extracted from the PLL (2). It is fed (35) into the sigma delta modulator (10) as well as being provided (36) to the synchronizer (31).

This architecture allows the phase modulator and the sigma delta modulator to be controlled by different clocks. In particular, the clock controlling the phase modulator may be a very high frequency, digital clock, running at a frequency much higher than that which can be achieved using a crystal oscillator. Problems with timing mismatches are overcome by synchronizing the output of the phase modulator so that it is aligned with the clock signal controlling the sigma delta modulator.

Figure 7:
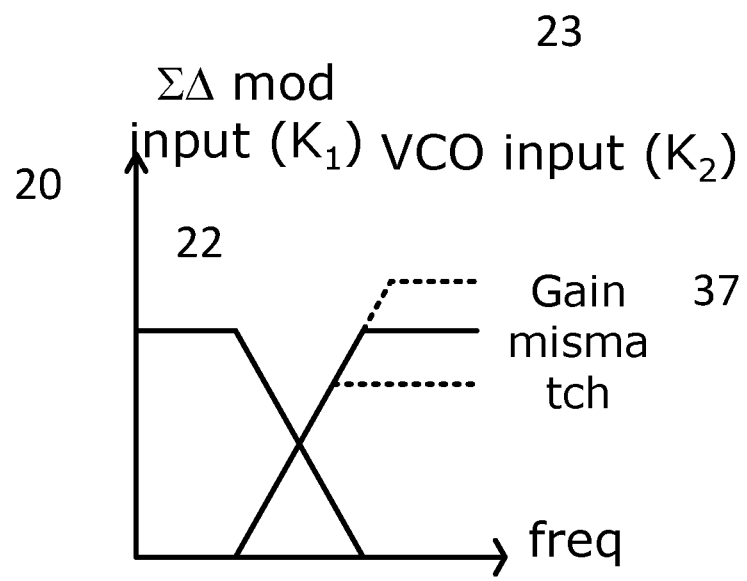
FIG. 7 is illustrates the frequency spectrum with gain mismatch between two modulation points of a two-point polar modulator.

Whilst these embodiments allow the phase modulator to be clocked at a much higher frequency thereby enabling much higher transmission rates, the solution does potentially introduce gain and delay mismatches between the two phase modulation points. This in turn might cause distortion of the transmission signal. FIG. 7 is a graph showing the frequency spectrum with gain mismatch (37) between the two modulation points.

In an embodiment, the problem of gain and delay mismatches may be addressed by introducing variable delay and gain compensation in each of the modulation signals. This ensures that there is no or limited gain or delay mismatch and hence no or limited signal distortion.

Figure 8:
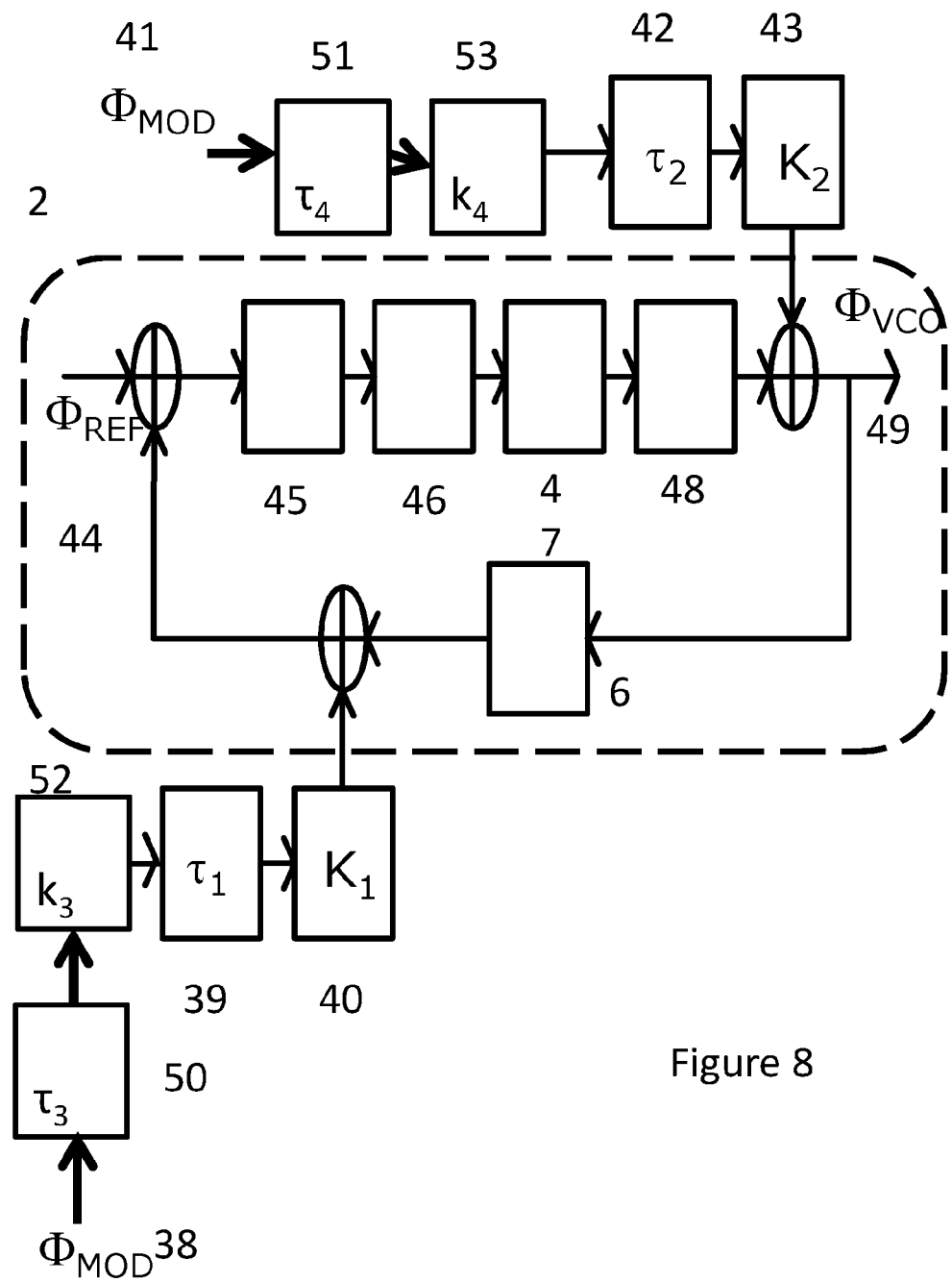
FIG. 8 is a schematic diagram of the two-point polar modulator according to an embodiment, showing the components in terms of their responses.

FIG. 8 is a schematic diagram of the two point phase modulation arrangement according to an embodiment, showing the components in terms of their responses. The first modulation signal φ (38) has a delay $T_1$ (39) and a gain $K_1$ (40). The second modulation signal (41) has a delay $T_2$ (42) and gain $K_2$ (43). In an embodiment, these inherent gains and delays are supplemented by additional variable components to ensure there is no gain or delay mismatch between the signals. These variable components comprise variable delay for first modulation signal (50), variable delay for the second modulation signal (51), variable gain for the first modulation signal (52) and variable gain for the second modulation signal (53). Once the signals have passed through the respective components, the signals are fed into the PLL (2). The PLL components are shown in terms of their responses. The reference signal (44) is fed into the phase detector (45), which compares the reference signal with the first modulation signal and passes the result through the low pass filter (46) and the VCO (47, 48), which also receives the second modulation signal.

Figure 9:
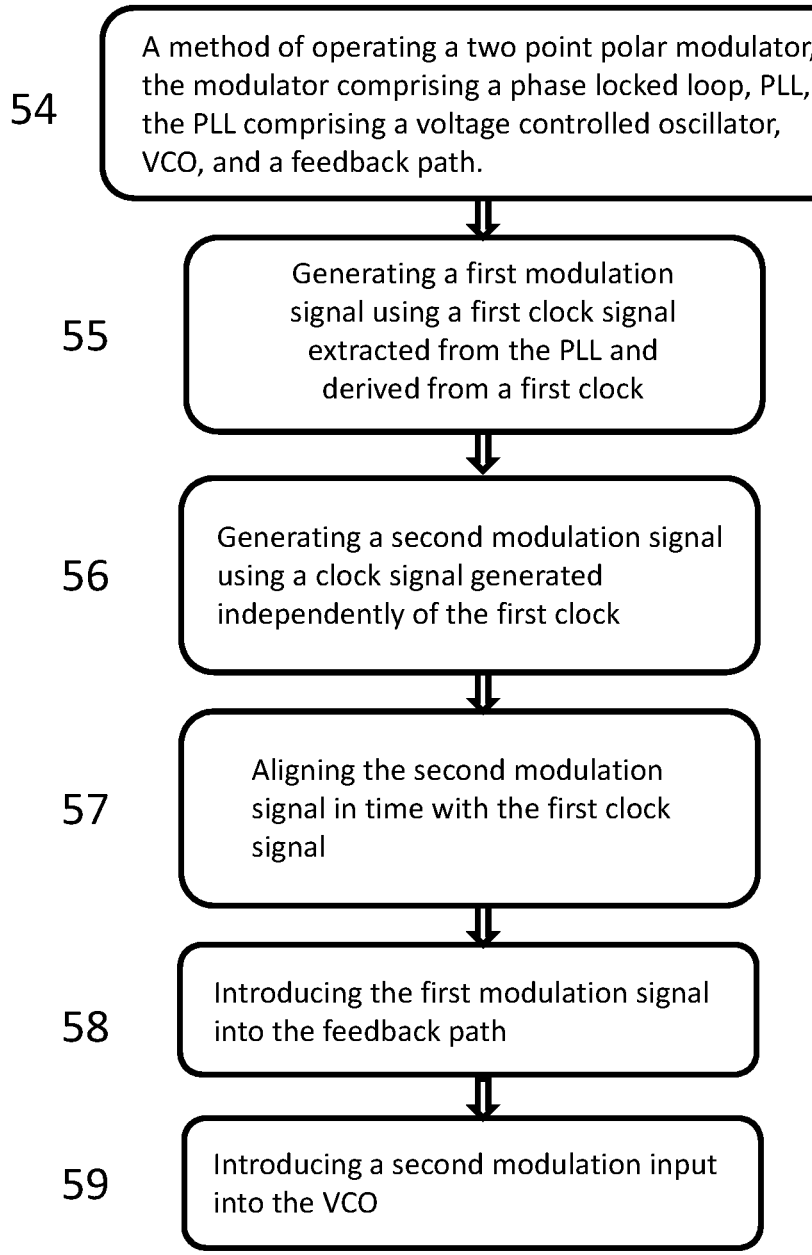
FIG. 9 is a flow chart showing a method of operating a two-point polar modulator according to an embodiment.

FIG. 9 is a flow chart illustrating a method of operating a two point polar modulator according to an embodiment. The method (54) uses a two point polar modulator according to an embodiment, wherein the modulator comprising a phase locked loop, PLL, the PLL comprising a VCO and a feedback loop. The method comprises generating (55) a first modulation signal using a first clock signal extracted from the PLL and derived from a first clock, generating (56) a second modulation signal using a clock signal generated independently of the first clock and aligning (57) the second modulation signal in time with the first clock signal. The first modulation signal is then introduced (58) into the feedback path and the second modulation input is introduced (59) into the VCO.

Figure 10:
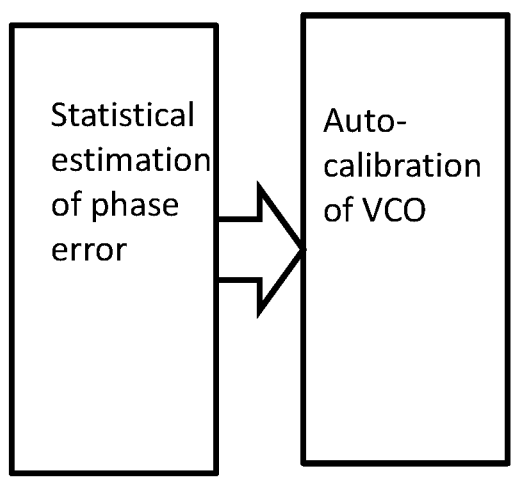
FIG. 10 is a flow chart of a method of auto-calibration of a VCO for use in an embodiment of a two-point polar modulator.

Another aspect of the invention addresses a problem of non-linearity in a VCO. A VCO is inherently non-linear, which means that phase errors can be introduced without calibration of the VCO. In order to address this problem, in an embodiment, there is introduced a statistical estimation of phase errors. FIG. 10 is a flowchart illustrating the steps of this method, starting with the statistical estimation of phase errors (60), followed by the auto-calibration (61) of the VCO.

The present disclosure has mainly been described above with reference to a few embodiments. However, as is readily appreciated by a person skilled in the art, other embodiments than the ones disclosed above are equally possible within the scope of the present disclosure, as defined by the appended claims.

The invention claimed is:

1. A two-point phase modulator comprising:
   a phase locked loop, PLL, having a voltage controlled oscillator, VCO, and a feedback path;
   a first modulation circuit for introducing a first modulation signal into the feedback path, the first modulation circuit generating the first modulation signal using a first clock signal extracted from the PLL and derived from a reference clock;
   a second modulation circuit for introducing a second modulation signal into the VCO, the second modulation circuit generating the second modulation signal using a second clock signal generated independently of the reference clock; and
   a synchronizer for aligning the second modulation signal in time with the first clock signal, prior to introducing the second modulation signal into the VCO.

2. The two point modulator as claimed in claim 1, wherein the reference clock comprises a reference signal source configured to provide a reference signal to the PLL.

3. The two point modulator as claimed in claim 1, wherein the first modulation signal is introduced into the PLL by a multi-modulus divider.

4. The two point modulator as claimed in claim 1, further comprising a sigma delta modulator for modulating the first modulation signal.

5. The two point modulator as claimed in claim 1, further configured to provide gain equalization between the first modulation signal and the second modulation signal.

6. The two point modulator as claimed in claim 1, further configured to provide delay equalization between the first modulation signal and the second modulation signal.

7. The two point modulator as claimed in claim 1, further configured to provide pre-distortion to the VCO to linearize an output of the VCO.

8. The two point modulator as claimed in claim 1, wherein the second clock signal is obtainable from an all-digital phase locked loop.

9. The two point phase modulator as claimed claim 1, wherein the second clock signal has higher frequency than the first clock signal.

10. A method of operating a two point polar modulator, the modulator comprising a phase locked loop, PLL, the PLL comprising a voltage controlled oscillator, VCO, and a feedback path, the method comprising the steps of:
generating a first modulation signal using a first clock signal extracted from the PLL and derived from a reference clock;
generating a second modulation signal using a second clock signal generated independently of the reference clock;
aligning the second modulation signal in time with the first clock; signal
introducing the first modulation signal into the feedback path; and
introducing the second modulation signal into the VCO.

11. The method as in claim 10, wherein the reference clock comprises a reference signal source configured to provide a reference signal to the PLL.

12. The method as claimed in claim 10, wherein the first modulation signal is introduced into the feedback loop using a multi-modulus divider.

13. The method as claimed in claim 10, further comprising modulating the first modulation signal using sigma delta modulation.

14. The method as claimed in claim 10, further comprising providing gain equalization between the first modulation signal and the second modulation signal.

15. The method as claimed in claim 10, further comprising providing delay equalization between the first modulation signal and the second modulation signal.

16. The method as claimed in claim 10, further comprising providing pre-distortion to the VCO to linearize an output of the VCO.

17. The method as claimed in claim 10, wherein the second clock signal is obtained from an all-digital phase locked loop.

18. The method as claimed in claim 10, wherein the second clock signal has higher frequency than the first clock signal.

* * * * *